United States Patent
Ichihara (10) Patent No.: US 7,127,224 B2
(45) Date of Patent: Oct. 24, 2006

(54) BASEBAND CIRCUIT INCORPORATED IN DIRECT CONVERSION RECEIVER FREE FROM DIRECT-CURRENT OFFSET VOLTAGE WITHOUT CHANGE OF CUT-OFF FREQUENCY

(75) Inventor: Masaki Ichihara, Tokyo (JP)

(73) Assignee: NEC Corporation, Tokyo (JP)

( * ) Notice: Subject to any disclaimer, the term of this patent is extended or adjusted under 35 U.S.C. 154(b) by 828 days.

(21) Appl. No.: 09/962,211

(22) Filed: Sep. 26, 2001

(65) Prior Publication Data

US 2002/0037706 A1   Mar. 28, 2002

(30) Foreign Application Priority Data

Sep. 28, 2000   (JP)   .............. 2000-296435

(51) Int. Cl.
  *H04Q 7/20*   (2006.01)
(52) U.S. Cl. .............. 455/240.1; 455/249.1; 455/236.1
(58) Field of Classification Search .......... 455/130, 455/231, 232.1, 234.1, 234.2, 236.1, 240.1, 455/249.1, 305, 306, 334, 338–341; 330/9; 375/316–318, 344–346

See application file for complete search history.

(56) References Cited

U.S. PATENT DOCUMENTS

| | | | | |
|---|---|---|---|---|
| 5,867,777 A | * | 2/1999 | Yamaji et al. | ........... 455/234.1 |
| 6,327,313 B1 | * | 12/2001 | Traylor et al. | .............. 375/316 |
| 6,516,187 B1 | * | 2/2003 | Williams et al. | ............ 455/313 |

FOREIGN PATENT DOCUMENTS

| | | |
|---|---|---|
| JP | 60-40116 | 3/1985 |
| JP | 60-186709 | 12/1985 |
| JP | 08-18357 | 1/1996 |

OTHER PUBLICATIONS

Pärssinen et al., "*A 2-GH, Wide-Band Direct Conversion Receiver for WCDMA Applications*", Journal of Solid-State Circuits, vol. 34, No. 12, Dec. 1999, pp. 1893-1903, no month.

Peter Kreuzgruber, "A Class of Binary FSK Direct Conversion Receivers," Vehicular Technology Conference, 1994 IEEE 4th Stockholm, Sweden Jun. 8-10, 1994, pp. 457-461.

Jan Crols et al., "Low-IF Topologies for High-Performance Analog Front Ends of Fully Integrated Receivers," IEEE Transactions on Circuits and System-II: Analog and Digital Signal Processing, V. 45, 1998, pp. 269-282, no month listed.

* cited by examiner

*Primary Examiner*—Jean Gelin
(74) *Attorney, Agent, or Firm*—Young & Thompson (57) ABSTRACT

A base band circuit forms a part of an automatic gain controller incorporated in a direct conversion receiver, and includes a series of variable gain amplifiers controlled by a gain controller and a feedback loop connected between the output node and the input node of the series of variable gain amplifiers, wherein the feedback loop has an attenuation circuit connected between the output node of the series of variable gain amplifiers and an inverted integrating circuit which, in turn, is connected through an adder and a low pass filter to the input node of the series of variable gain amplifiers so that direct current offset voltage is eliminated from the output signal of the series of variable gain amplifiers without change of cut-off frequency.

14 Claims, 9 Drawing Sheets

BASEBAND CIRCUIT INCORPORATED IN DIRECT CONVERSION RECEIVER FREE FROM DIRECT-CURRENT OFFSET VOLTAGE WITHOUT CHANGE OF CUT-OFF FREQUENCY

FIELD OF THE INVENTION

This invention relates to a direct conversion receiver and, more particularly, to a base band circuit incorporated in the direct conversion receiver.

DESCRIPTION OF THE RELATED ART

The super heterodyne reception is popular to the radio receiving equipment. A typical example of the super heterodyne receiver behaves as follows. An incoming RF signal captured by an antenna is firstly converted to an intermediate frequency signal. The intermediate frequency signal is amplified and, thereafter, is detected for reproducing base band signals. Both of the incoming RF signal and the intermediate frequency signal are within a frequency band higher than the frequency band assigned the base band signals. Although the circuit components for the base band signals are easily integrated on a semiconductor chip, the circuit components for the incoming signal and the intermediate frequency signal are hardly integrated on a semiconductor chip.

In this situation, attention is drawn to a direct conversion reception. A direct conversion receiver directly converts the incoming RF signal to base band signals through a quadrature demodulator. The direct conversion reception is simpler in the circuits operative in the high-frequency band than the super heterodyne reception. For example, the circuit components of the filter circuit are eliminated from the direct conversion receiver, and the circuit operative in the high-frequency band is simplified. The band-pass filter and the automatic gain controller are operative in the frequency band for the base band signals. For this reason, the manufacturer is able to fabricate the analog circuits by using CMOS (Complementary Metal-Oxide-Semiconductor) transistors. This means that the analog circuits are to be integrated on a semiconductor chip. Thus, the direct conversion reception is attractive, and will be employed in various receivers.

Figure 1:
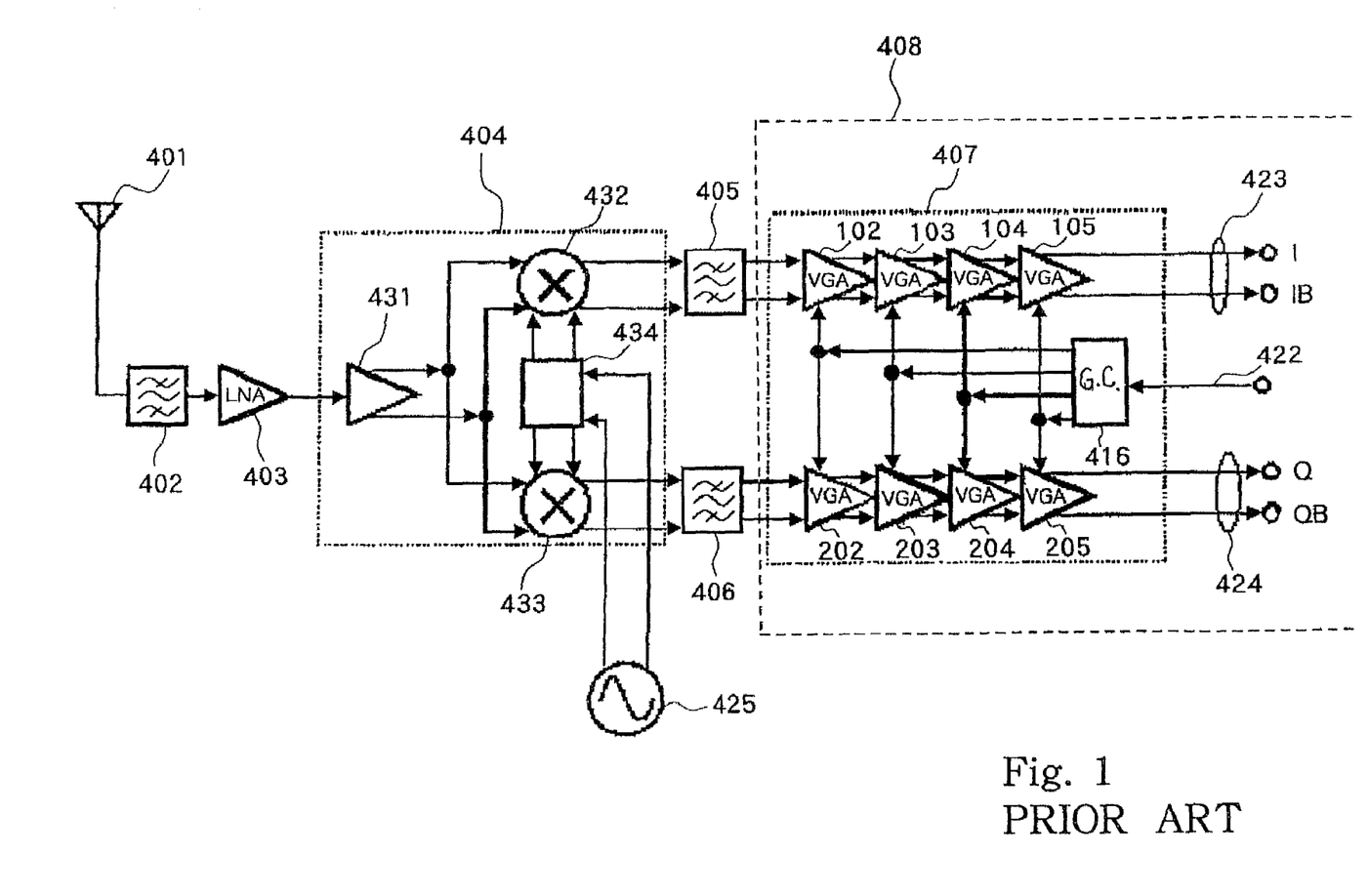
FIG. 1 is a circuit diagram showing the circuit configuration of the prior art direct conversion receiver.

FIG. 1 shows a typical example of the direct conversion receiver. The prior art direct conversion receiver comprises an antenna 401, a high-frequency band pass filter 402, a low-noise amplifier 403, a quadrature demodulator 404, base band filters 405/406, a base band circuit 408 and a local oscillator 425. The antenna 401 receives an incoming signal, and transfers the incoming signal to the high-frequency band pass filter 402. The low noise amplifier 403 is abbreviated as "LNA" in FIG. 1, and supplies a single-end signal to the quadrature demodulator 404.

The quadrature demodulator 404 includes a buffer amplifier 431, multipliers 432/433 and a phase shifter 434. The local oscillator 425 generates a local oscillating signal, and supplies the local oscillating signal to the phase shifter 434. The buffer amplifier converts the single-end signal to a differential signal, and supplies the differential signal to the multipliers 432/433. The phase shifter 434 produces a cosine wave signal and a sine wave signal from the local oscillating signal, and supplies the cosine wave signal and the sine wave signal to the multipliers 432/433. The multipliers 432/433 multiplies the value represented by the differential signal by the value represented by the cosine wave/sine

2 wave signals, and outputs base band signals representative of values on the coordinate axes, i.e., I/Q values. The base band signals are respectively supplied through the base band filters 405/406 to the base band circuit 408.

The base band circuit includes an automatic gain controller 407. The automatic gain controller 407 has variable gain amplifiers 102, 103, 104, 105, 202, 203, 204, 205 and a gain controller 416. The variable gain amplifiers 102, 103, 104, 105, 201, 202, 203, 204, 205 are abbreviated as "VGA", and the gain controller 416 is abbreviated as "G.C." in FIG. 1. The variable gain amplifiers 102, 103, 104, 105 are connected in series, and the base band signal representative of I value is supplied to the first variable gain amplifier 102. Variable gain amplifiers 202, 203, 204, 205 are also connected in series, and the other base band signal representative of Q value is supplied to the variable gain amplifier 202. The gain controller 416 is responsive to a gain control signal 422 so as to control the gain of the variable gain amplifiers 102 to 105 and 202 to 205. The gain control signal 422 is supplied from the outside of the base band circuit 408 to the gain controller 416, and the gain controller 416 produces internal gain control signals from the gain control signal 422. The gain controller 416 selectively supplies the internal gain control signals to the variable gain amplifiers 102 to 105 and 202 to 205. The variable gain amplifiers 102 to 105 and 202 to 205 are responsive to the internal gain control signals so as to vary the gain. While the base band signals are passing through the series of variable gain amplifiers 102 to 105 and the series of variable gain amplifiers 202 to 205, the base band signals are appropriately amplified, and the base band signals 423 and 424 are output from the automatic gain controller 407.

Assuming now that the antenna 401 receives the incoming signal, the incoming signal is transferred from the antenna 401 to the high-frequency band pass filter 402, and signal components in a predetermined frequency band are extracted from the incoming signal. The signal components of the incoming signal are supplied from the high-frequency band pass filter 402 to the low noise amplifier 403. The signal components are amplified by the low noise amplifier 403, and, thereafter, are supplied to the quadrature demodulator 404. The quadrature demodulator 404 is driven by the local oscillating signal, and directly converts the high-frequency signal components to the base band signals. The local oscillating signal is adjusted to the center frequency of the incoming signal. The base band signals are representative of the values on the coordinate axes, i.e., I value and Q value. The base band signals are supplied through the base band filters 405/406 to the base band circuit 408.

The base band circuit 408 amplifies the base band signals in such a manner that the average amplitude is constant. The algorithm employed in the gain controller 416 does not directly concern the present invention. For this reason, no further description on the gain controller 416 is incorporated hereinbelow. After the amplification, the base band signals 423 and 424 are output from the automatic gain controller 407 to the next stage.

In the direct conversion reception, the base band filters 405/406 serve as a channel filter, and restricts the adjacent channels. Any kind of intermediate frequency filter such as, for example, a surface acoustic wave filter, which is usually abbreviated as "SAW" filter, is not used in the direct conversion reception. However, the base band filter 405/406 are operative in the base band. For this reason, the base band filters 405/406 are fabricated from active circuit elements. This means that the base band filters 405/406 are to be integrated on a single semiconductor chip. Moreover, the base band signals are directly produced from the high-frequency incoming signal, and, accordingly, any second local oscillator is not required. The second local oscillator is used in the signal conversion from the intermediate frequency signal to the base band signals in the super heterodyne reception. Thus, the component circuits to be required for the direct conversion reception are less than those incorporated in the super heterodyne reception. The reduction in circuit components and the low-frequency signal processing permit the manufacturer to integrate the low noise amplifier 403 to the automatic gain controller 407 on a single semiconductor chip, and the semiconductor integrated circuit device is preferable for a handy telephone.

Nevertheless, if there remains a small amount of direct-current offset voltage in the base band filter 405/406, saturation tends to take place in the automatic gain controller 407, because the gain of the automatic gain controller 407 is of the order of tens dB. When the saturation takes place, the output is stuck in the power voltage or the ground voltage. This phenomenon is serious in a receiver in the W-CDMA (Wide Band Code Division Multiple Access) system, because the reception signal is large in dynamic range. In fact, the dynamic range of the automatic gain controller 407 is of the order of 80 dB. The output signal is much liable to be stuck in the presence of an extremely small amount of direct current offset voltage.

The direct current offset voltage and the gain are assumed to be 1 millivolt in the base band filter 405 and 80 dB in the automatic gain controller 407. The gain of 80 dB is equivalent to 10,000 times. The output signal of the base band filter 405 is amplified ten thousands times, and the direct current offset voltage is increased from 1 millivolt to 10 volts. The receiver is a mobile telephone. The direct current offset voltage exceeds the output voltage of the battery, and the mobile telephone becomes inoperative. Thus, the direct current offset voltage is undesirable for the base band circuit of the direct conversion receiver. In order words, it is necessary to eliminate the direct-current offset voltage from the base band circuit of the direct conversion receiver.

Figure 2:
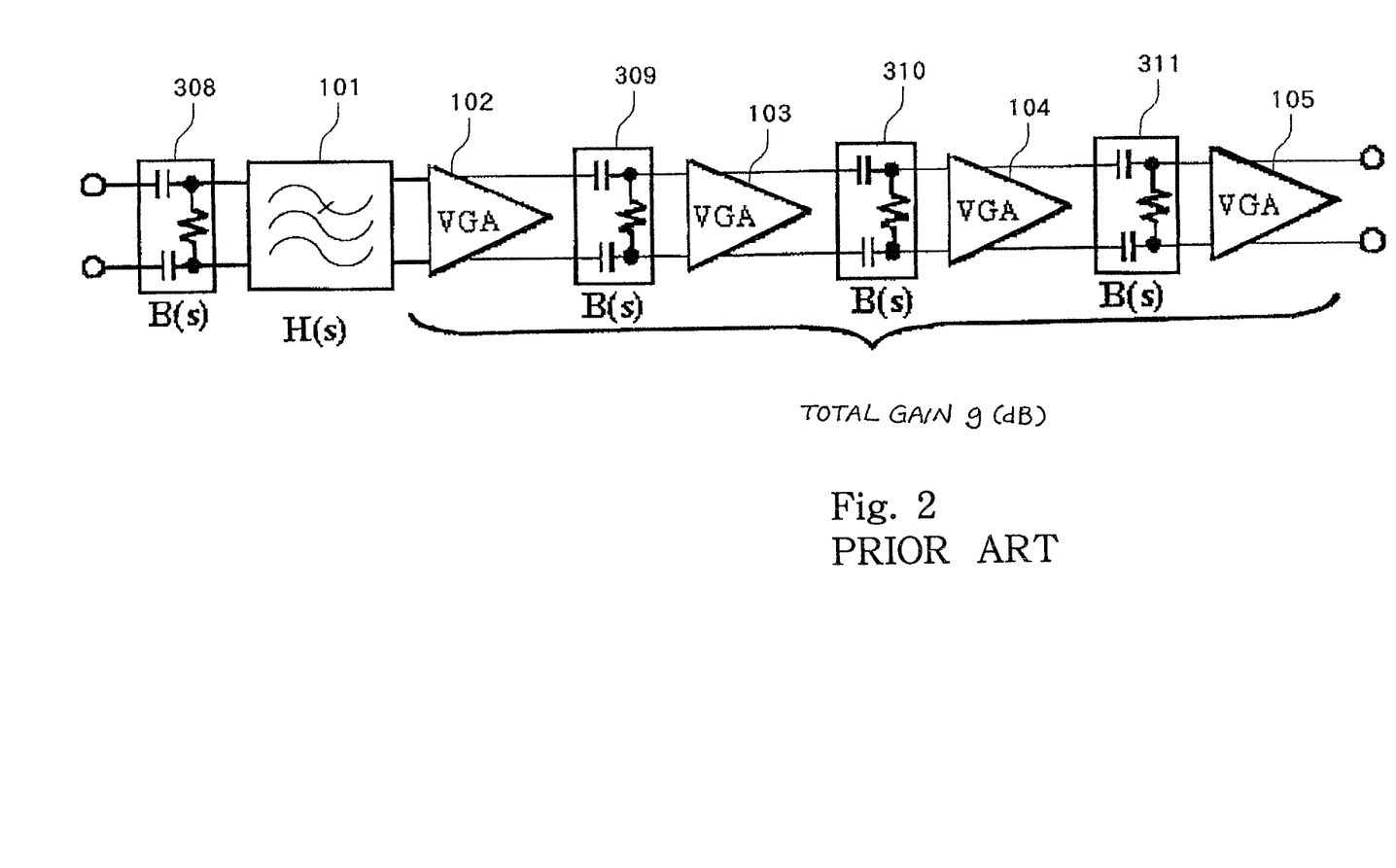
FIG. 2 is a circuit diagram showing the circuit configuration of the prior art automatic gain controller with the high pass filters for eliminating the direct current off-set voltage from the output signal.

A simple approach to elimination of the direct current offset voltage is insertion of the condenser-cutting circuit. FIG. 2 shows a typical example of the condenser-cutting circuit. The variable gain amplifiers 102, 103, 104 and 105 form the automatic gain controller 407, and high pass filters 308, 309, 310 and 311 for the condenser cutting are inserted among the low pass filter 101 for the band restriction and the variable gain amplifiers 102, 103, 104 and 105. The transfer function B(S) of the high pass filters 308–311 is expressed as B(S)=S/(S+α). The high pass filters 308 to 311 block the direct current offset voltage, and, accordingly, eliminate the direct current offset voltage from the output signal of the automatic gain controller 407. However, the prior art automatic gain controller shown in FIG. 2 causes the semiconductor chip to be large. This is because of the fact that the plural high pass filters 308, 309, 310 and 311 are required for the individual circuits 101, 102 to 105 in order to perfectly eliminate the direct current offset voltage from the output signal of the automatic gain controller and the fact that large condensers are required for the high pass filters 308, 309, 310 and 311 in order to achieve the cut-off frequency as low as possible. Other problems inherent in the prior art automatic gain controller shown in FIG. 2 are a serious deformation of signal waveform and increase of the error rate. These problems are derived from the insertion of the plural high pass filters 308, 309, 310 and 311.

Figure 3:
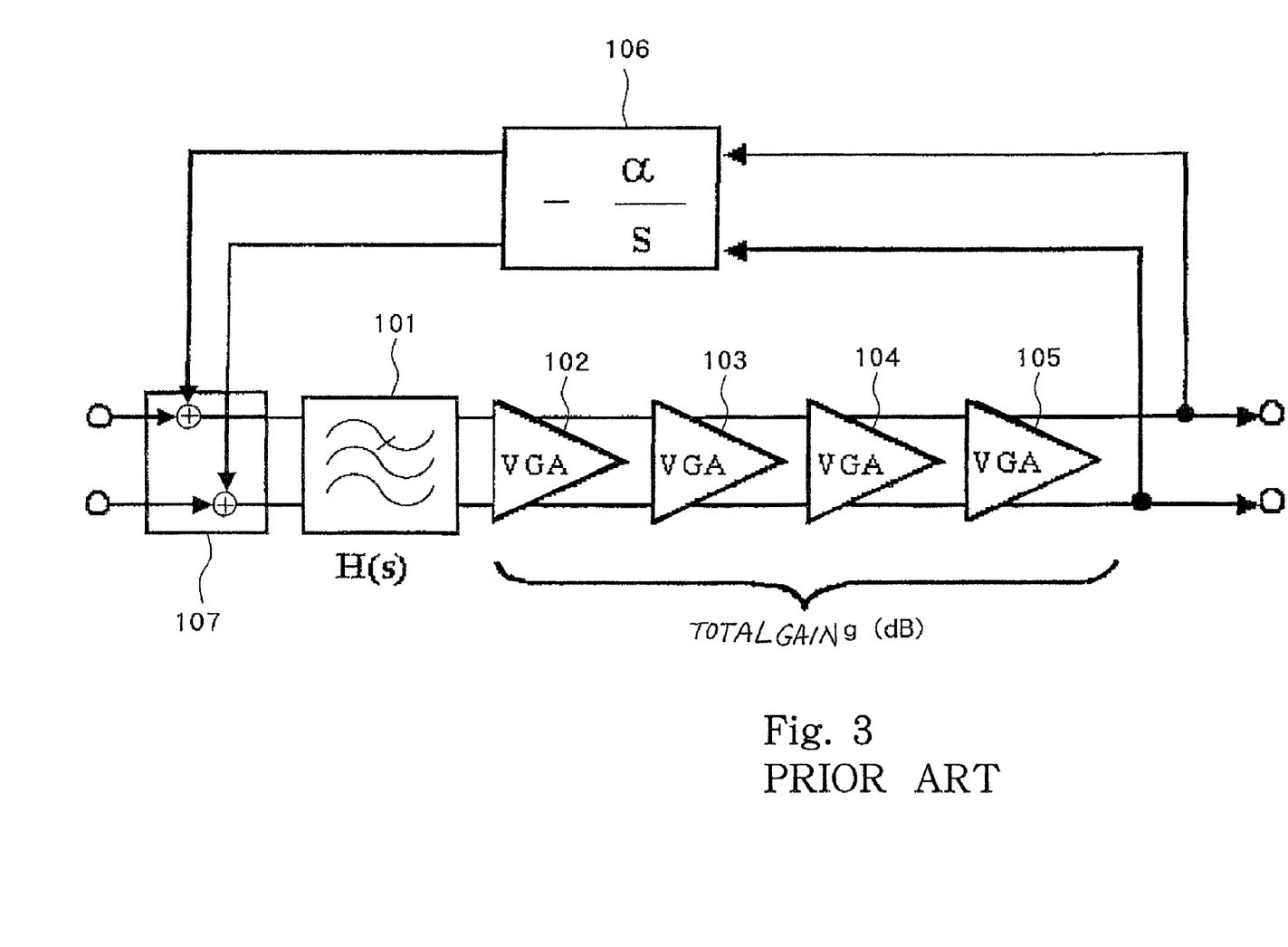
FIG. 3 is a circuit diagram showing the circuit configuration of the base band circuit disclosed in the paper in IEEE Journal of Solid-State Circuit.

A base band circuit shown in FIG. 3 has been proposed as a solution of the problems inherent in the prior art circuit shown in FIG. 2. A direct current feedback technology is employed in the base band circuit shown in FIG. 3, and is disclosed by Aarno Parssinen, Jarkko Jussila, Jussi Ryynanen, Lauri Sumanen and Kari A. I. Halonen in "A 2-GHz Wide-Band Direct Conversion Receiver for WCDMA Applications", IEEE Journal of Solid-State Circuit, vol. 34, No. 12, December 1999, pages 1893 to 1903.

The base band circuit shown in FIG. 3 includes a low pass filter 101, variable gain amplifiers 102 to 105, an inverting integrating circuit 106 and an adder 107. The direct current offset voltage is eliminated from the output signal through the feedback loop consisting of the inverting integrating circuit 106 and the adder 107. In detail, the output signal of the variable gain amplifier 105 is supplied to the inverting integrating circuit 106, and the inverting integrating circuit 106 extracts the direct current component from the output signal. The direct current component is supplied from the inverting integrating circuit 106 to the adder 107, and the adder 107 adds the direct current component to the input signal at the input nodes of the low pass filter 101. Thus, the feedback loop eliminates the direct current offset voltage from the signal propagation through the low pass filter 101 and the series of variable gain amplifiers 102, 103, 104 and 105.

Figure 4:
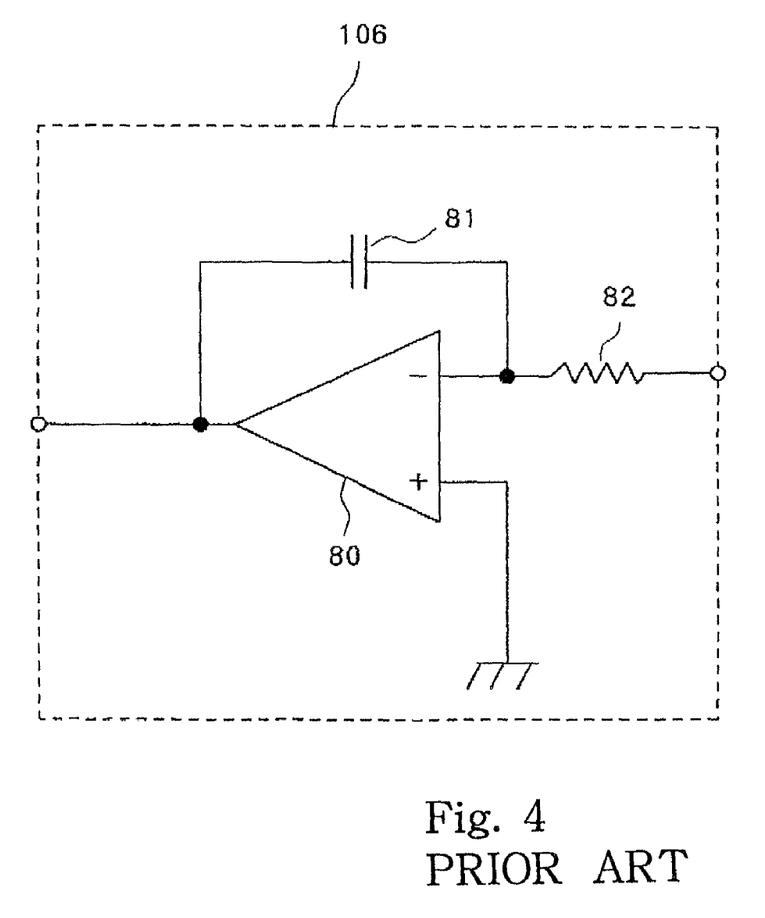
FIG. 4 is a circuit diagram showing the circuit configuration of the inverting integrating circuit incorporated in the prior art base band circuit.

The inverting integrating circuit 106 has the circuit configuration shown in FIG. 4. The inverting integrating circuit 106 includes an operational amplifier 80, a condenser 81 and a resistor 82. The operational amplifier 80 has the non-inverted input node connected to the ground, and the output signal is supplied through the resistor 82 to the inverted input node of the operational amplifier 80. The condenser 81 is connected between the inverted input node and the output node of the operational amplifier 80. The transfer function of the inverting integrating circuit 106 is expressed as $-1/(CRS)$ where R is the resistance of the resistor 82 and C is the capacitance of the condenser 81. The coefficient $\alpha$ is expressed as $1/CR$.

The prior art base band circuit shown in FIG. 3 has the transfer function R(s) expressed as $$R(s)=(g \cdot H(s))/(1+g \cdot H(s)(\alpha/s))=g \cdot (s \cdot H(s))/(s+g \cdot H(s) \cdot \alpha) \quad \text{Equation 1}$$

where g is the total gain of the variable gain amplifiers 102 to 105, H(s) is the transfer function of the low pass filter 101 for the band restriction and $\alpha$ is the coefficient of the inverting integrating circuit 106.

On the axis representative of the angular frequency ($\omega$), equation 1 is rewritten as $$R(j\omega)=g \cdot (j\omega/(j\omega+g \cdot H(j\omega) \cdot \alpha)) \cdot H(j\omega) \quad \text{Equation 2}$$

The direct current offset voltage is serious in a low frequency band, and the transfer function $H(j\omega)$ of the low pass filter is approximated to 1. Substituting 1 for $H(j\omega)$, equation 2 is rewritten as $$R(j\omega)=g \cdot (j\omega/(j\omega+g \cdot \alpha)) \quad \text{Equation 3}$$

Thus, the gain is g, and the cut-off frequency fc is $$Fc=(g \cdot \alpha)/2\pi \quad \text{Equation 4}$$

Thus, the base band circuit is considered to be a first-order high pass filter.

Only the inverting integrating circuit 106 and the adder 107 are required for the prior art base band circuit as shown in FIG. 3, and eliminate the direct current offset voltage from all the component circuits, i.e., the low pass filter 101 and the variable gain amplifiers 102, 103, 104 and 105. Comparing the prior art base band circuit shown in FIG. 3 with the prior art base band circuit shown in FIG. 2, it is understood that the combination of the inverting integrating circuit 106 and the adder 107 is simpler than the combination of the high pass filters 308, 309, 310 and 311. Moreover, the deformation introduced by the inverting integrating circuit 106 and the adder 107 is not serious rather than the deformation introduced by the high pass filters 308 to 311.

Figure 5:
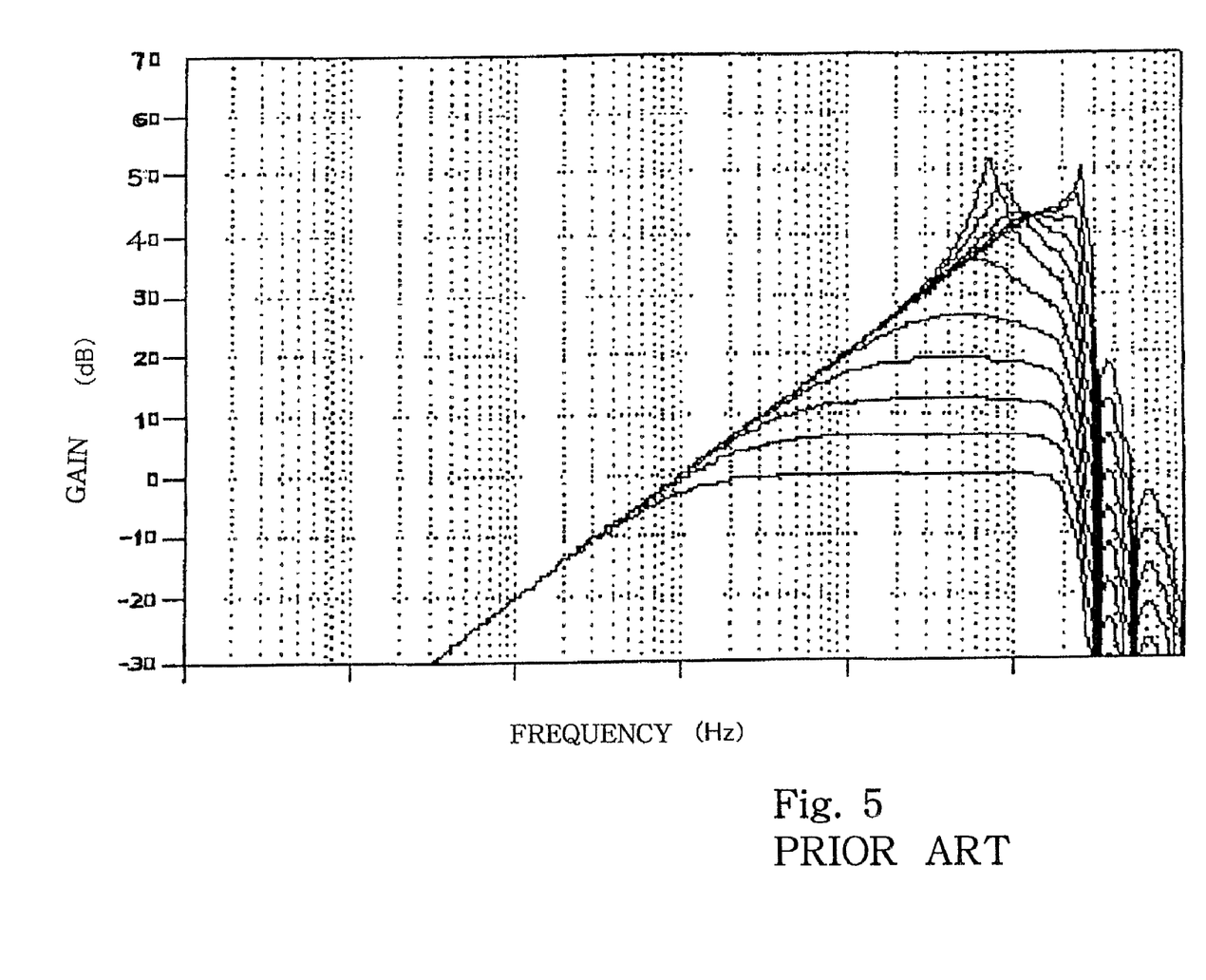
FIG. 5 is a graph showing the frequency characteristics of the amplitude achieved by the prior art base band circuit.

However, another problem is encountered in the prior art base band circuit shown in FIG. 3 in that the cut-off frequency is varied in proportional to the total gain g of the variable gain amplifiers 102 to 105. FIG. 5 shows the frequency characteristics of the amplitude achieved by the prior art base band circuit shown in FIG. 3, and the frequency characteristics are plotted by using equation 2. The total gain g is varied from 0 dB to 66 dB at intervals of 6 dB. As will be understood, when the total gain is increased, the cut-off frequency is shifted toward the high frequency side, and the overall amplitude is widely deformed.

SUMMARY OF THE INVENTION

It is therefore an important object of the present invention to provide a base band circuit which exhibits stable frequency characteristics of the amplitude of an output base band signal regardless of the total gain.

To accomplish the object, the present invention proposes to attenuate an output base band signal at an attenuating factor corresponding to the total gain of a series of variable gain controller before extracting a direct current component.

In accordance with one aspect of the present invention, there is provided a base band circuit for producing an output base band signal from an input base band signal comprising a first low pass filter circuit supplied at an input port thereof with the input base band signal for restricting a frequency band of the input base band signal and outputting a filtrate signal from an output port thereof, a series of variable gain amplifiers forming a series circuit together with the first low pass filter circuit and responsive to an internal gain control signal indicating a gain to be achieved so as to produce the output base band signal from the filtrate signal at an output port of the series circuit through an amplification at the gain, and a feedback loop connected between the output port of the series circuit and an input port of the series circuit and including a direct current component extracting circuit attenuating the output base band signal with an attenuation factor corresponding to the gain and extracting a direct current component from the output base band signal and an eliminating circuit eliminating the direct current component from the input base band signal.

The feedback loop firstly attenuates the output base band signal, and, thereafter, extracts the direct current component. The cut-off frequency is influenced by the coefficient of a second low pass filter of the direct current eliminating circuit. This results in elimination of the direct current component without change of the cut-off frequency.

BRIEF DESCRIPTION OF THE DRAWINGS

The features and advantages of the base band circuit will be more clearly understood from the following description taken in conjunction with the accompanying drawings in which.

DESCRIPTION OF THE PREFERRED EMBODIMENTS

First Embodiment

Figure 6:
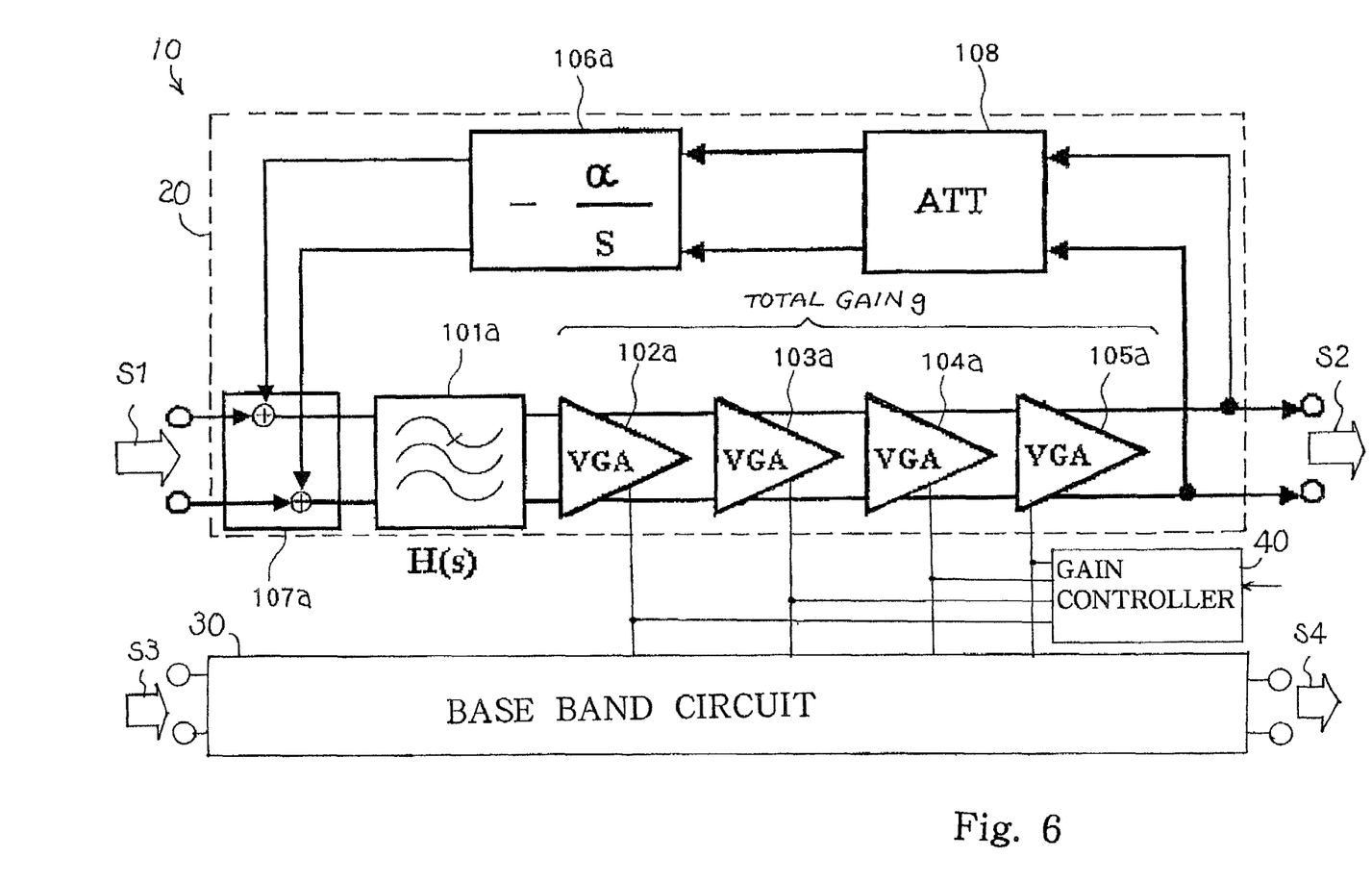
FIG. 6 is a circuit diagram showing the circuit configuration of a base band circuit according to the present invention.

Referring to FIG. 6 of the drawings, an automatic gain controller 10 embodying the present invention largely comprises two base band circuits 20 and 30 and a gain controller 40. The base band circuits 20 and 30 are similar in circuit configuration to each other, and only one base band circuit 20 is illustrated in detail in FIG. 6.

The automatic gain controller 10 forms a part of a direct conversion receiver together with an antenna, a high-frequency band pass filter, a low-noise amplifier, a quadrature demodulator, base band filters and a local oscillator. The antenna, the high-frequency band pass filter, the low-noise amplifier, the quadrature demodulator, the base band filters and the local oscillator are similar to the antenna 401, a high-frequency band pass filter 402, a low-noise amplifier 403, a quadrature demodulator 404, base band filters 405/406 and a local oscillator 425, respectively, and are connected as similar to those shown in FIG. 1. For this reason those circuits are not shown in FIG. 6. Nevertheless, the antenna, the high-frequency band pass filter, the low-noise amplifier, the quadrature demodulator, the base band filters and the local oscillator are labeled with references 401, 402, 403, 404, 405/406 and 425 designating the corresponding circuits in FIG. 1.

The direct conversion receiver according to the present invention behaves as follows. The antenna 401 receives an incoming signal, and transfers the incoming signal to the high-frequency band pass filter 402. The low noise amplifier 403 supplies a single-end signal to the quadrature demodulator 404. The quadrature demodulator 404 includes a buffer amplifier 431, multipliers 432/433 and a phase shifter 434. The local oscillator 425 generates a local oscillating signal, and supplies the local oscillating signal to the phase shifter 434. The buffer amplifier 431 converts the single-end signal to a differential signal, and supplies the differential signal to the multipliers 432/433. The phase shifter 434 produces a cosine wave signal and a sine wave signal from the local oscillating signal, and supplies the cosine wave signal and the sine wave signal to the multipliers 432/433. The multipliers 432/433 multiplies the value represented by the differential signal by the value represented by the cosine wave/sine wave signals, and outputs base band signals representative of values on the coordinate axes, i.e., I/Q values. The base band signals are respectively supplied through the base band filters 405/406 to the base band circuit 20 and 30. The base band signals are labeled with S1 and S3 in FIG. 6.

The gain controller 40 is responsive to an external control signal, and produces internal gain control signals. The internal gain control signals are supplied to the base band circuits 20 and 30, and the base band signals 20 and 30 produce base band output signals S2/S4 from the base band signals S1/S3.

The base band circuit 20 includes a low-pass filter 101a, variable gain amplifiers 102a/103a/104a/105a, an inverting integrating circuit 106a, an adder 107a and an attenuating circuit 108. The low-pass filter 101a, the variable gain amplifiers 102a/103a/104a/105a, the inverting integrating circuit 106a and the adder 107a are similar to the low-pass filter 101, the variable gain amplifiers 102/103/104/105, the inverting integrating circuit 106 and the adder 107, respectively, and the attenuating circuit 108 is newly connected between the variable gain amplifier 105a and the inverting integrating circuit 106a. Thus, the attenuating circuit 108, the inverting integrating circuit 106a and the adder 107a form in combination a feedback loop. The attenuating circuit 108 attenuates the base band output signal S2. The amount of attenuation is adjusted to the inverse of the total gain g of the variable gain amplifiers 102a/103a/104a/105a.

The transfer function R(s) of the base band circuit 20/30 is expressed by equation 5.

$$R(s)=(g \cdot H(s))/(1+g \cdot H(s) \cdot (\alpha/(s \cdot g)))=g \cdot (s \cdot H(s))/(s+H(s) \cdot \alpha)$$ Equation 5 where g is the total gain of the variable gain amplifiers 102a/103a/104a/105a, H(s) is the transfer function of the low-pass filter 101 for the band restriction and α is the coefficient of the inverting integrating circuit 106a.

On the axis representative of the angular frequency (ω), equation 5 is rewritten as $$R(j\omega)=g \cdot (j\omega/(j\omega+H(j\omega) \cdot \alpha)) \cdot H(j\omega)$$ Equation 6

The elimination of the direct current offset voltage is carried out in a low frequency band, and the transfer function H(jω) of the low pass filter 101a is assumed to be 1. Equation 6 is rewritten as $$R(j\omega)=g \cdot (j\omega/(j\omega+\alpha))$$ Equation 7

From equation 7, the base band circuit 20/30 is a kind of first order high pass filter which has the gain g and the cut-off frequency fc expressed as $$fc=\alpha/2\pi$$ Equation 8

As will be understood, equation 8 does not include the total gain g. In other words, the total gain g of the variable gain amplifiers 102a/103a/104a/105a does not have any influence on the cut-off frequency fc.

Figure 7:
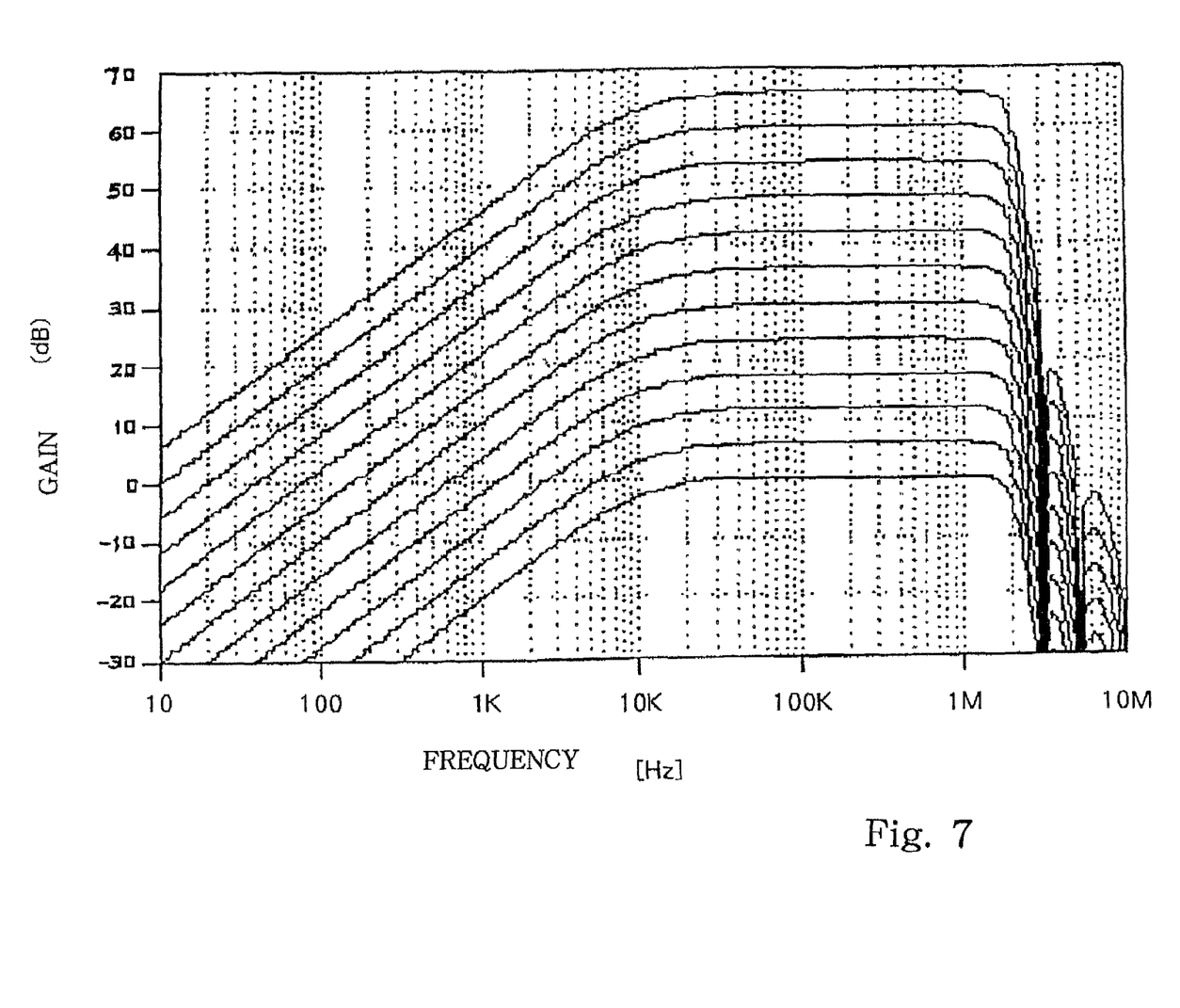
FIG. 7 is a graph showing the frequency characteristics of the amplitude achieved by the base band circuit.

The frequency characteristics of the amplitude are shown in FIG. 7. The frequency characteristics are calculated on the basis of equation 6. The total gain g is varied from 0 dB to 66 dB at intervals of 6 dB. As will be understood, even though the total gain g is varied, the base band circuit 20/30 exhibits the frequency characteristics equivalent to one another. Thus, the attenuation circuit 108 is effective against the unstable frequency characteristics. The feedback loop according to the present invention includes the attenuation circuit 108, and, accordingly, the direct current offset voltage is eliminated from the output base band signal S2/S4 without change of the cut-off frequency.

Second Embodiment

Figure 8:
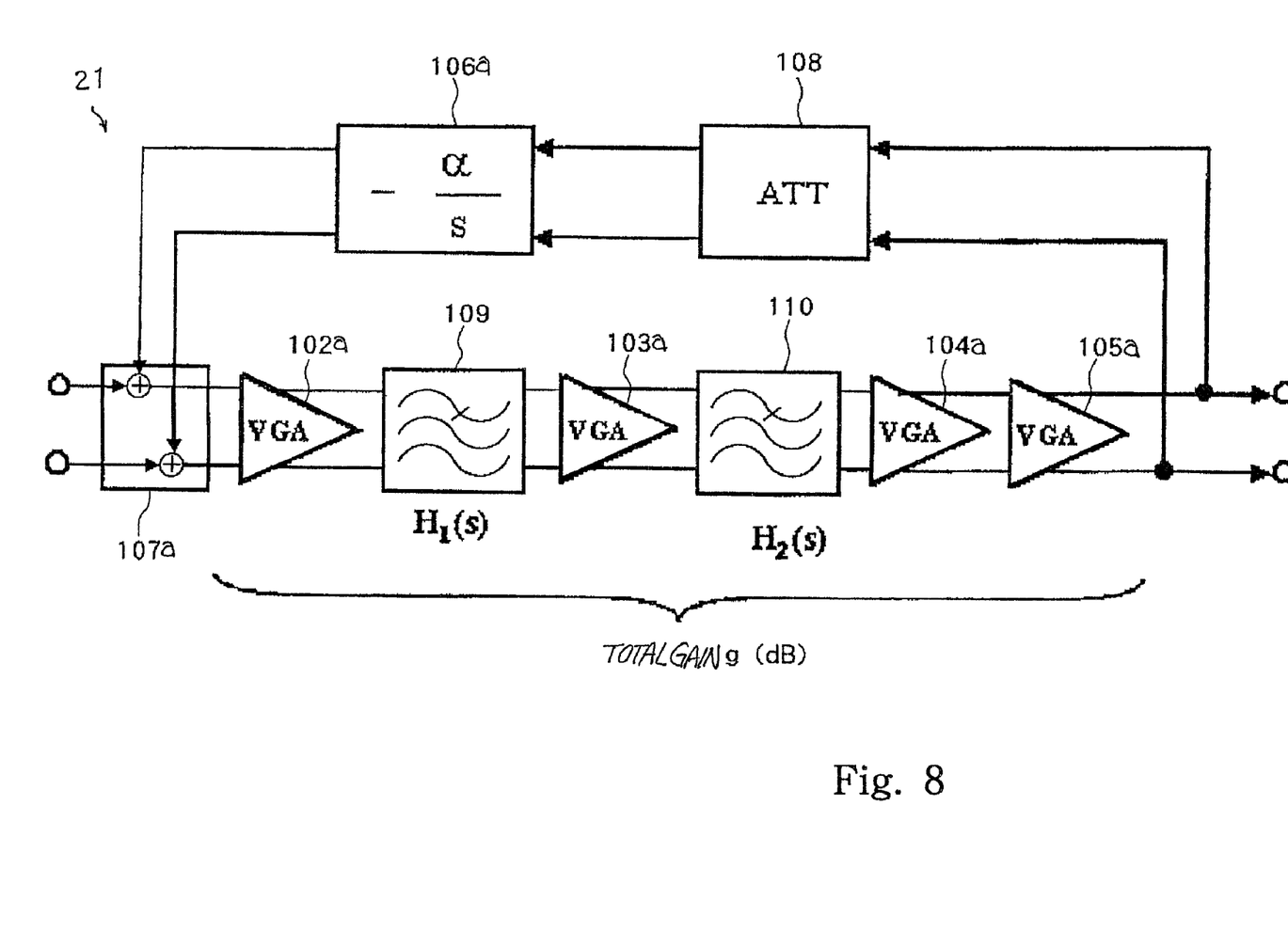
FIG. 8 is a circuit diagram showing the circuit configuration of another base band circuit according to the present invention.

Turning to FIG. 8 of the drawings, another base band circuit 21 comprises variable gain amplifiers 102a/103a/104a/105a, an inverting integrating circuit 106a, an adder 107a, an attenuation circuit 108 and low pass filters 109/110. The base band circuit 21 is available for an automatic gain controller incorporated in a direct conversion receiver. The variable gain amplifiers 102a/103a/104a/105a, the inverting integrating circuit 106a, the adder 107a and the attenuation circuit 108 are similar to those of the base band circuit 20 described hereinbefore in detail, and no further description is hereinbelow incorporated.

Comparing FIG. 8 with FIG. 6, the low pass filter 101a is replaced with the two low pass filters 109/110. When severe selectivity is required between adjacent channels, it is desirable to replace the low pass filter 101a with the plural low pass filters 109/110. The variable gain amplifier 103a is inserted between the low pass filters 109 and 110, and the variable gain controller 102a is connected between the adder 107a and the low pass filter 109. Thus, the arrangement of the circuits is to be changed. The base band circuit 21 achieves all the advantages of the first embodiment.

Third Embodiment

Yet another base band circuit embodying the present invention is similar to the base band circuits implementing the first and second embodiments except the feedback loop. As described hereinbefore, the base band circuits implementing the first and second embodiments have the feedback loop implemented by the combination of the attenuation circuit 108, the inverting integrating circuit 106a and the adder 107a. The feedback loop incorporated in the base band circuit implementing the third embodiment has an inverting integrating circuit 818 (see FIG. 9) and the adder 107a. In other words, the inverting integrating circuit 106a and the attenuation circuit 108 are replaced with the single inverting integrating circuit 818.

Figure 9:
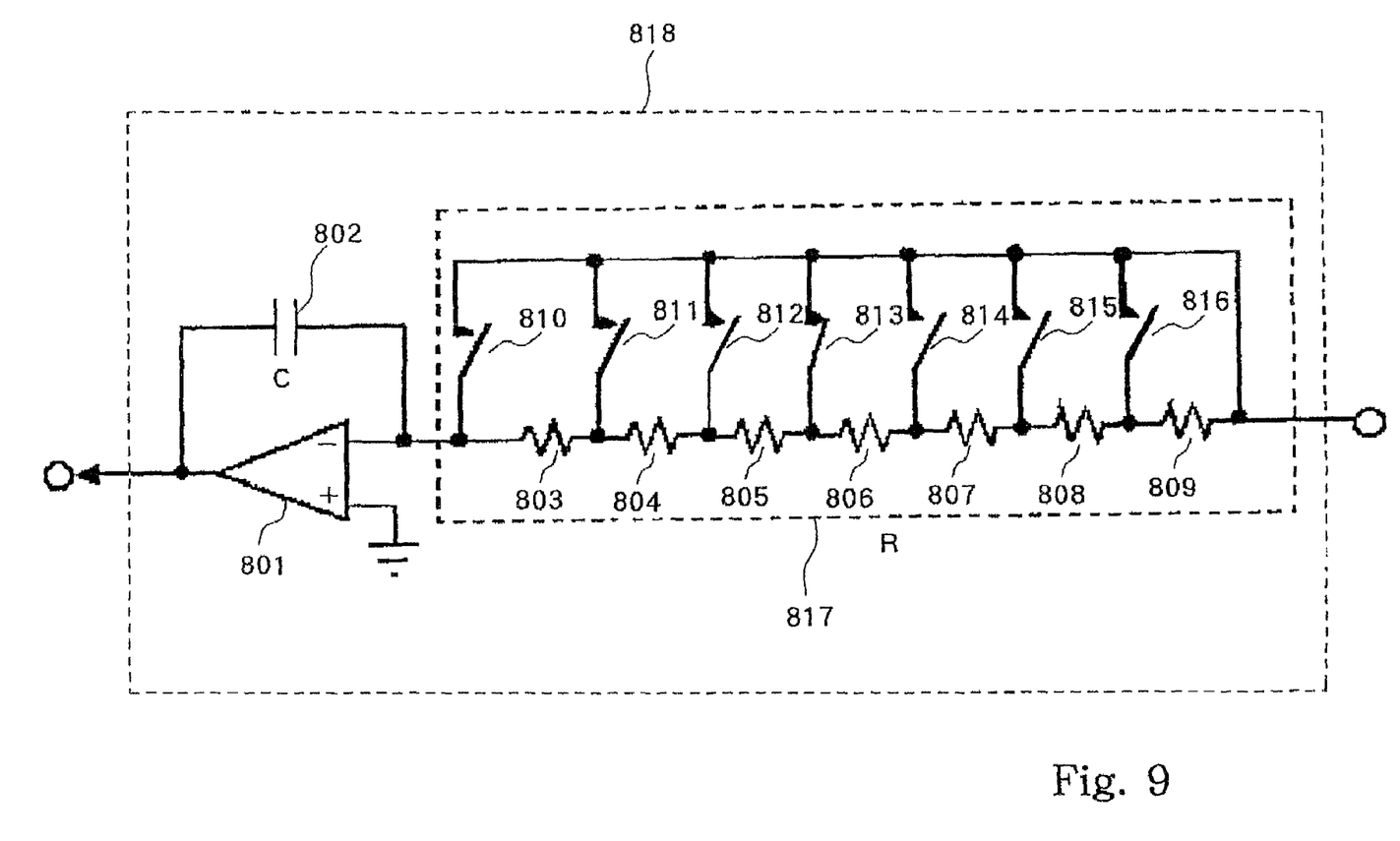
FIG. 9 is a circuit diagram showing the circuit configuration of an inverting integrating circuit incorporated in yet another base band circuit according to the present invention.

The inverting integrating circuit 818 includes an operational amplifier 801, a condenser 802 and a variable resistor 817. The operational amplifier 801 has the non-inverted input node which is grounded. The operational amplifier 801 further has the inverted input node connected to the output node through the condenser 802. The variable resistor 817 is connected between the variable gain amplifier l05a and the inverted input node of the operational amplifier 801. A series of resistor elements 803/804/805/806/807/808/809 and switching elements 810/811/812/813/814/815/816 form in combination the variable resistor 817. The switching elements 810/811/812/813/814/815/816 are connected at the input nodes thereof to the node between the variable gain amplifier 105a, and the output base band signal is supplied to the switching elements 810/811/812/813/814/815/816. The switching elements 810/812/813/814/815/816 are connected at the output nodes thereof to the nodes in the series of resistor elements 803/804/805/806 807/808/809. The each of switching elements 810/811/812/813/814/815/816/ 816 is changed between on-state and off-state independently of the other switching elements. Thus, the resistance between the variable gain amplifier 105a and the inverted input node of the operational amplifier 801 is varied depending upon the state of the switching elements 810/811/812/813/814/815/816.

The coefficient α of the inverting integrating circuit 818 is expressed by equation 9.

$$\alpha = 1/(C \cdot R) \quad \text{Equation 9}$$

where C is the capacitance of the condenser 802 and R is the resistance of the variable resistor 817. When the resistance R is varied in proportional to the total gain g, the resistance is expressed as $$R = g \cdot R0 \quad \text{Equation 10}$$

Equation 4 is rewritten as $$fc = (g \cdot \alpha)/2\pi = (g \cdot 1)/(2\pi \cdot CR) = g/(2\pi \cdot C \cdot g \cdot R0) = 1/(2\pi \cdot C \cdot R0) = \alpha 0/2\pi \quad \text{Equation 11}$$

As will be understood, even if the total gain g is varied, the cut-off frequency is unchanged. Thus, the base band circuit equipped with the feedback loop achieves advantages similar to those of the first and second embodiments.

The attenuating circuit 108 and the inverting integrating circuit 106a as a whole constitute a direct current component extracting circuit in the first and second embodiment, and the inverting integrating circuit 818 serves as the direct current component extracting circuit in the third embodiment. The adder 107a is corresponding to an eliminating circuit in the first, second and third embodiments. The low pass filter 101a serves as a first low pass filter in the first and third embodiments, and the low pass filters 109 and 110 form in combination the first low pass filter in the second embodiment. The inverting integrating circuit 106a serves as a second low pass filter.

Although particular embodiments of the present invention have been shown and described, it will be apparent to those skilled in the art that various changes and modifications may be made without departing from the spirit and scope of the present invention.

The base band circuit may be incorporated in another kind of electric circuit. In other words, the application of the base band circuit according to the present invention is not limited to the direct conversion receiver.

What is claimed is:

1. A base band circuit for producing an output base band signal from an input base band signal, comprising:
   a first low pass filter circuit supplied at an input port thereof with said input base band signal for restricting a frequency band of said input base band signal, and outputting a filtrate signal from an output port thereof;
   a series of variable gain amplifiers forming a series circuit together with said first low pass filter, and responsive to an internal gain control signal indicating a gain to be achieved so as to produce said output base band signal from said filtrate signal at an output port of said series circuit through an amplification at said gain; and
   a feedback loop connected between said output port of said series circuit and an input port of said series circuit, and including
   a direct current component extracting circuit that continuously attenuates said output base band signal with an attenuation factor corresponding to said gain and extracts a direct current component from said output base band signal and
   an eliminating circuit eliminating said direct current component from said input base band signal.

2. The base band circuit as set forth in claim 1, in which said direct current component extracting circuit includes
   an attenuation circuit connected to said output port of said series circuit and attenuating said output base band signal at said attenuation factor for producing an attenuated signal from said output base band signal, and
   a second low pass filter connected between said attenuation circuit and said input port of said series circuit and extracting said direct current component from said attenuated signal for producing a direct current component signal representative of a value of said direct current component.

3. The base band circuit as set forth in claim 2, in which said second low pass filter is an inverting integrating circuit.

4. The base band circuit as set forth in claim 1, in which said eliminating circuit has an adder for subtracting a value of said direct current component from a value of said input base band signal.

5. The base band circuit as set forth in claim 1, in which said first low pass filter circuit is connected between said eliminating circuit and said series of variable gain amplifiers.

6. The base band circuit as set forth in claim 1, in which said first low pass filter has plural low pass filter circuits.

7. The base band circuit as set forth in claim 6, in which one of said plural low pass filter circuits is connected between adjacent variable gain amplifiers incorporated in said series of variable gain amplifiers.

8. The base band circuit as set forth in claim 6, in which said plural low pass filter circuits are inserted into said series of variable gain amplifiers.

9. The base band circuit as set forth in claim 1, in which said series of variable gain amplifiers is connected to a gain controller responsive to an external gain control signal for changing said gain.

10. The base band circuit as set forth in claim 9, in which said gain controller is further connected to another base band circuit similar in circuit configuration to said base band circuit so as to implement an automatic gain controller.

11. The base band circuit as set forth in claim 10, in which said automatic gain controller is incorporated in a direct conversion receiver.

12. The base band circuit as set forth in claim 11, in which direct conversion receiver further comprises
   an antenna for receiving an income signal,
   a high frequency band pass filter connected to said antenna for producing a high frequency signal from said income signal,
   an amplifier connected to said high frequency band pass filter and increasing the magnitude of said high frequency signal for producing a single-end signal from said high frequency signal,
   a local oscillator for producing a local oscillating signal,
   a quadrature demodulator connected to said amplifier and said local oscillator for producing two signals representative of values on coordinate axes of a quadrature coordinate from said single-end signal and said local oscillating signal, and
   base band filters connected between said quadrature demodulator and said automatic gain controller for producing the input base band signals from said two signals.

13. A base band circuit for producing an output base band signal from an input base band signal, comprising:
   a first low pass filter circuit supplied at an input port thereof with said input base band signal for restricting a frequency band of said input base band signal, and outputting a filtrate signal from an output port thereof;
   a series of variable gain amplifiers forming a series circuit together with said first low pass filter, and responsive to an internal gain control signal indicating a gain to be achieved so as to produce said output base band signal from said filtrate signal at an output port of said series circuit through an amplification at said gain; and a feedback loop connected between said output port of said series circuit and an input port of said series circuit, and including a direct current component extracting circuit attenuating said output base band signal with an attenuation factor corresponding to said gain and extracting a direct current component from said output base band signal, and an eliminating circuit eliminating said direct current component from said input base band signal, said direct current component extracting circuit including, an attenuation circuit connected to said output port of said series circuit and attenuating said output base band signal at said attenuation factor for producing an attenuated signal from said output base band signal, and an inverting integrating circuit connected between said attenuation circuit and said input port of said series circuit and extracting said direct current component from said attenuated signal for producing a direct current component signal representative of a value of said direct current component, and wherein said inverting integrating circuit includes, a resistor connected to said output port of said series circuit, an operational amplifier having an inverted input node connected to said resistor, a non-inverted input node connected to a constant voltage source and an output node for outputting said direct current component signal and a condenser connected between said inverted input node and said output node of said operational amplifier.

14. A base band circuit for producing an output base band signal from an input base band signal, comprising:

a first low pass filter circuit supplied at an input port thereof with said input base band signal for restricting a frequency band of said input base band signal, and outputting a filtrate signal from an output port thereof;

a series of variable gain amplifiers forming a series circuit together with said first low pass filter, and responsive to an internal gain control signal indicating a gain to be achieved so as to produce said output base band signal from said filtrate signal at an output port of said series circuit through an amplification at said gain; and a feedback loop connected between said output port of said series circuit and an input port of said series circuit, and including a direct current component extracting circuit attenuating said output base band signal with an attenuation factor corresponding to said gain and extracting a direct current component from said output base band signal and an eliminating circuit eliminating said direct current component from said input base band signal, in which said direct current component extracting circuit is an inverting integrating circuit including a variable resistor connected at an output node thereof to said output port of said series circuit and producing a variable resistance against said output base band signal, an operational amplifier having an inverted input node connected to an output node of said variable resistor, a non-inverted input node connected to a constant voltage source and an output node for outputting a direct current component signal representative of a value of said direct current component, and a condenser connected between said inverted input node and said output node of said operational amplifier.

* * * * *